(12) United States Patent
Eissler et al.

(10) Patent No.: US 8,502,204 B2
(45) Date of Patent: Aug. 6, 2013

(54) OPTOELECTRONIC MODULE

(75) Inventors: Dieter Eissler, Nittendorf/Etterzhausen (DE); Siegfried Herrmann, Neukirchen (DE)

(73) Assignee: OSRAM Opto Semiconductors GmbH (DE)

( * ) Notice: Subject to any disclaimer, the term of this patent is extended or adjusted under 35 U.S.C. 154(b) by 226 days.

(21) Appl. No.: 12/922,199

(22) PCT Filed: May 13, 2009

(86) PCT No.: PCT/DE2009/000679
§ 371 (c)(1), (2), (4) Date: Nov. 30, 2010

(87) PCT Pub. No.: WO2009/140947
PCT Pub. Date: Nov. 26, 2009

(65) Prior Publication Data
US 2011/0108860 A1    May 12, 2011

(30) Foreign Application Priority Data

May 23, 2008  (DE) .......... 10 2008 024 927
Sep. 30, 2008  (DE) .......... 10 2008 049 777

(51) Int. Cl.
*H01L 29/08* (2006.01)
*H01L 35/24* (2006.01)
*H01L 51/00* (2006.01)

(52) U.S. Cl.
USPC ........ 257/40; 257/13; 257/443; 257/14; 257/186; 257/189; 438/23; 438/33

(58) Field of Classification Search
USPC .......... 257/40, 13, 443, 14, 186, 189; 438/23, 438/33
See application file for complete search history.

(56) References Cited

U.S. PATENT DOCUMENTS

| | | |
|---|---|---|
| 4,777,516 A | 10/1988 | Deschler et al. |
| 5,789,766 A | 8/1998 | Huang et al. |
| 6,355,945 B1 | 3/2002 | Kadota et al. |
| 6,410,941 B1 | 6/2002 | Taylor et al. |
| 6,885,035 B2 | 4/2005 | Bhat et al. |
| 2002/0149314 A1 | 10/2002 | Takahashi et al. |
| 2005/0128767 A1 | 6/2005 | Wang et al. |
| 2005/0179042 A1 | 8/2005 | Yang et al. |
| 2007/0200512 A1 | 8/2007 | Gotou et al. |
| 2009/0001490 A1 | 1/2009 | Bogner et al. |

FOREIGN PATENT DOCUMENTS

| | | |
|---|---|---|
| DE | 196 08 898 A1 | 10/1996 |
| JP | 2003-8075 | 1/2003 |
| JP | 2003-17574 | 1/2003 |
| JP | 2005-136224 | 5/2005 |
| WO | 2005/024898 A2 | 3/2005 |
| WO | 2005/104249 | 11/2005 |
| WO | 2008/131736 A1 | 11/2008 |

*Primary Examiner* — Telly Green
(74) *Attorney, Agent, or Firm* — DLA Piper LLP (US)

(57) ABSTRACT

An optoelectronic module includes a layer structure having a plurality of semiconductor layers including a substrate layer, a first layer arrangement and a second layer arrangement, wherein 1) the first layer arrangement has a light-emitting layer arranged on the substrate layer, 2) the second layer arrangement contains at least one circuit that controls an operating state of the light-emitting layer, and 3) the second layer arrangement is arranged on the substrate layer and/or surrounded by the substrate layer.

16 Claims, 4 Drawing Sheets

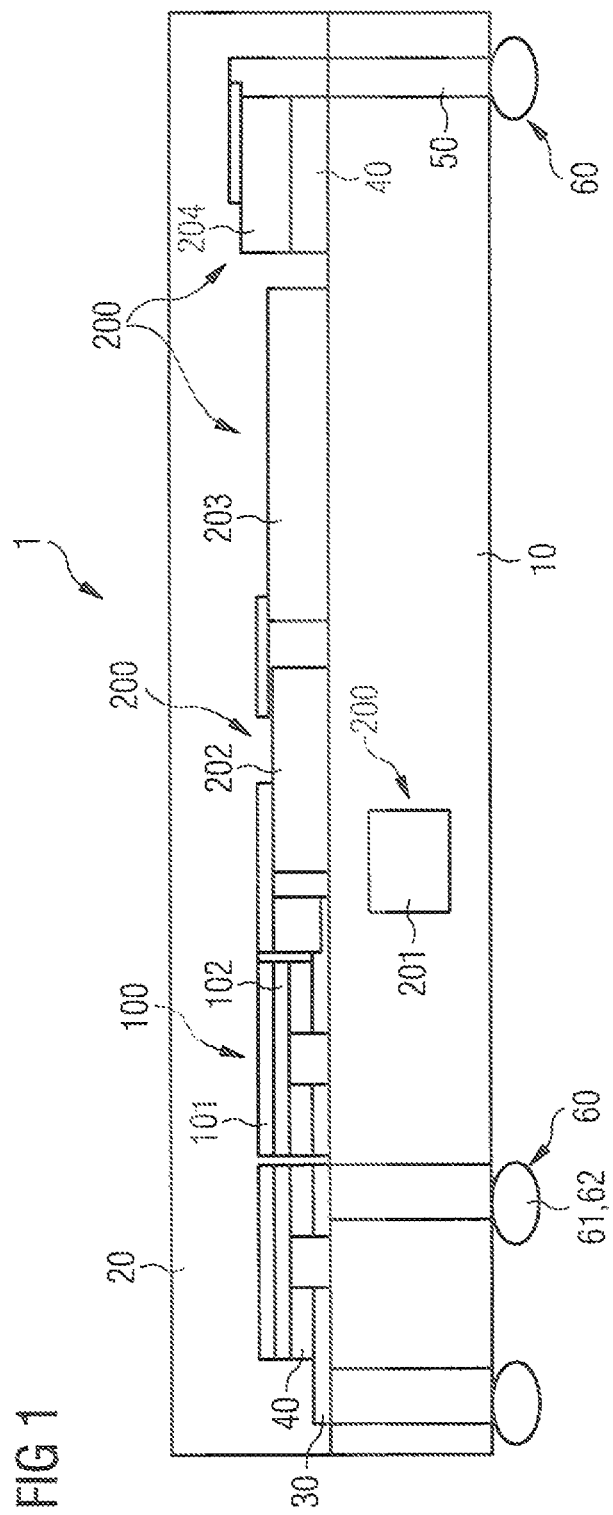

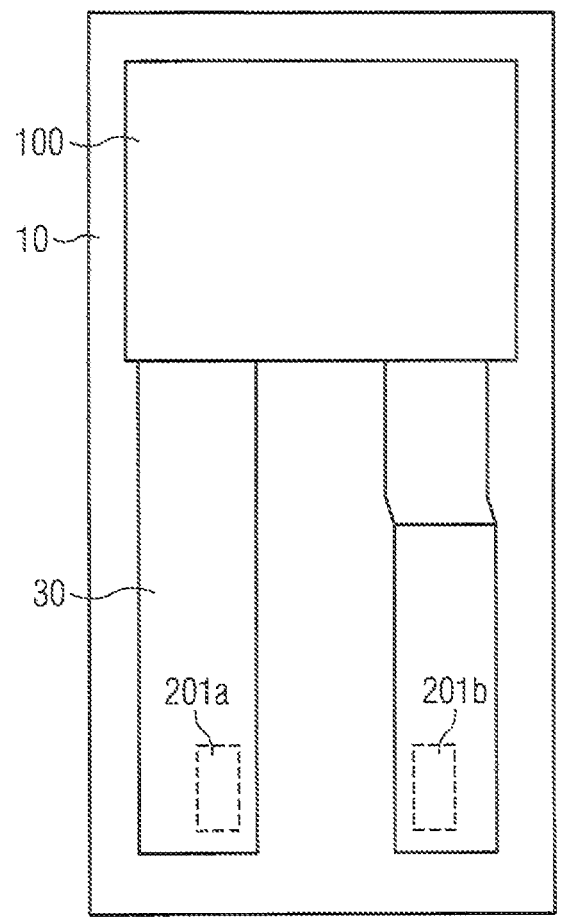
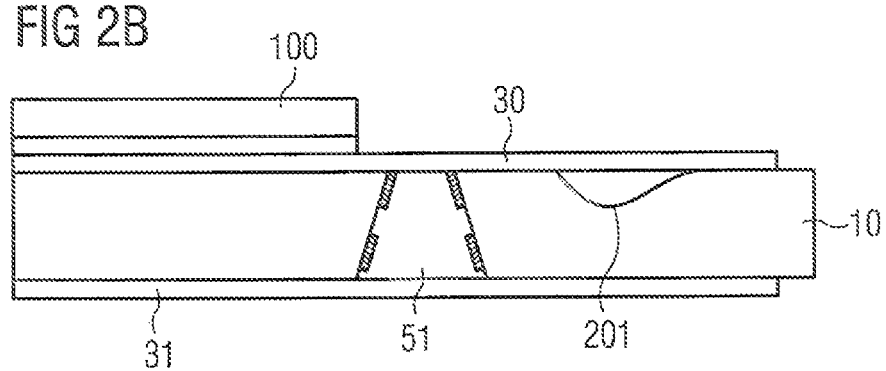

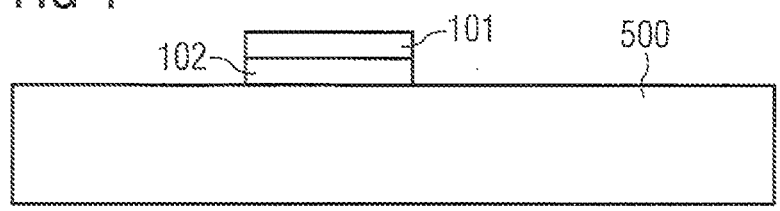
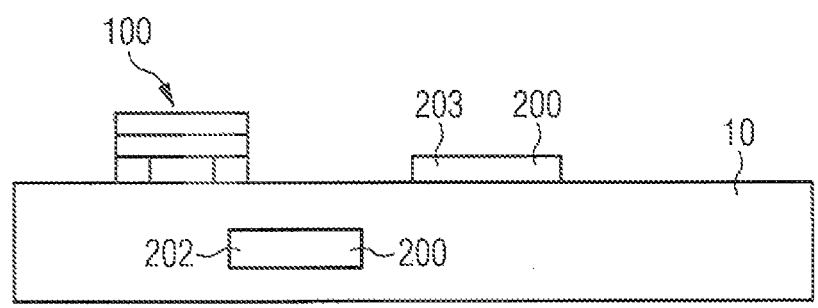
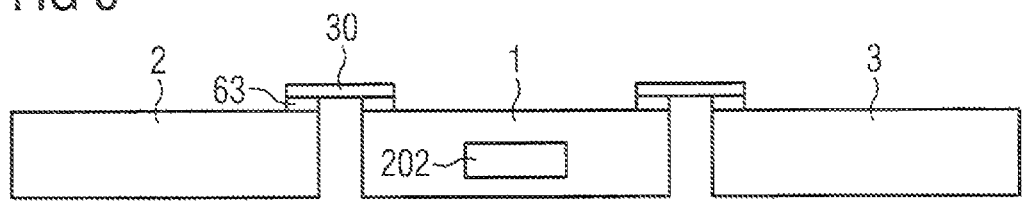

OPTOELECTRONIC MODULE

RELATED APPLICATIONS

This is a §371 of International Application No. PCT/DE2009/000679, with an international filing date of May 13, 2009 (WO 2009/140947 A2, published Nov. 26, 2009), which is based on German Patent Application Nos. 10 2008 024 927.0, filed May 23, 2008, and 10 2008 049 777.0, filed Sep. 30, 2008, the subject matter of which is incorporated by reference.

TECHNICAL FIELD

This disclosure relates to an optoelectronic module containing an integrated circuit for controlling a light-emitting structure. The disclosure furthermore relates to an optoelectronic module arrangement composed of a plurality of optoelectronic modules of this type. The disclosure additionally relates to a method for producing an optoelectronic module.

BACKGROUND

Optoelectronic modules having a plurality of light-emitting components are used for the effective illumination of objects. The light-emitting components can be LEDs (light-emitting diode), for example, which are fixed and electrically contact-connected on a module circuit board of the module. The modules are usually connected up using hybrid technology, wherein the individually placed light-emitting components can also be distributed among a plurality of module circuit boards. Regulating and control circuits are used for controlling the light emission of the light-emitting components. The LEDs can be controlled by sensors, for example, which are applied as discrete components on the module circuit board. The discrete components have a housing in which a chip is arranged. Consequently, alongside the LED chips, by way of example, the module circuit board is populated with components in whose housings are arranged chips with sensors for light measurement, temperature measurement or color locus measurement.

The driving and regulating electronics and also the sensors and high-performance heat sinks are not integrated on or in the module on which the light-emitting components are arranged.

It could therefore be helpful to provide an optoelectronic module which makes it possible to control the light generation of light-emitting structures in an effective manner. It could further be helpful to provide an optoelectronic module in which the light generation of light-emitting structures is controlled in an effective manner. It could still further be helpful to provide a method for producing an optoelectronic module of this type.

SUMMARY

We provide an optoelectronic module including a layer structure having a plurality of semiconductor layers including a substrate layer, a first layer arrangement and a second layer arrangement, wherein 1) the first layer arrangement has a light-emitting layer arranged on the substrate layer, 2) the second layer arrangement contains at least one circuit that controls an operating state of the light-emitting layer, and 3) the second layer arrangement is arranged on the substrate layer and or surrounded by the substrate layer.

We also provide a method of producing an optoelectronic module including growing a first layer arrangement having a light-emitting layer onto a carrier layer, providing a layer structure having a plurality of semiconductor layers including a substrate layer and a second layer arrangement, wherein the second layer arrangement contains a circuit that controls an operating state of the light-emitting layer, and applying the first layer arrangement to the substrate layer.

BRIEF DESCRIPTION OF THE DRAWINGS

FIG. 1 shows a first example of an optoelectronic module.

FIG. 2A shows a plan view of a second example of an optoelectronic module with an ESD protection circuit.

FIG. 2B shows a section through the example embodiment of the optoelectronic module with an ESD protection circuit.

FIG. 4 shows light-emitting layers grown on a carrier layer.

FIG. 5 shows a prepatterned carrier substrate into which circuits for controlling a light emission of light-emitting layers are integrated.

FIG. 6 shows an optoelectronic module arrangement comprising a plurality of integrated optoelectronic modules.

DETAILED DESCRIPTION

Figure 3:
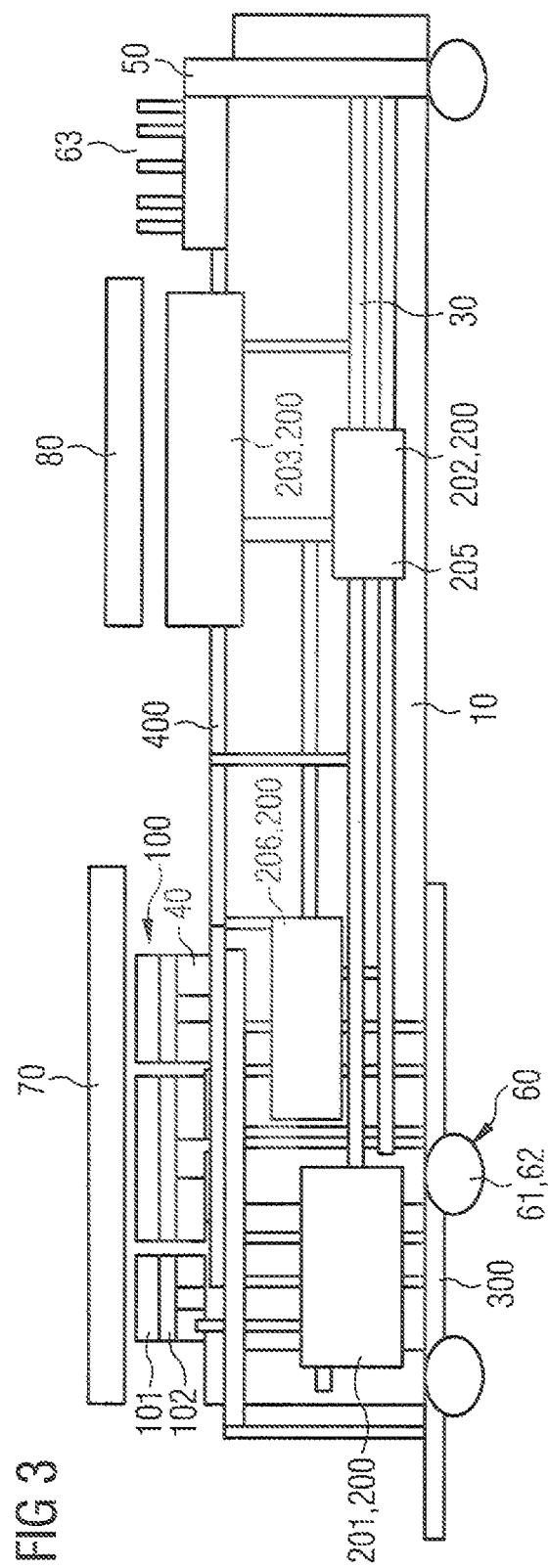
FIG. 3 shows a third example of an optoelectronic module.

An optoelectronic module has a layer structure having a plurality of semiconductor layers, wherein the plurality of semiconductor layers comprise a substrate layer, a first layer arrangement and at least one second layer arrangement. The first layer arrangement has a light-emitting layer arranged on the substrate layer. The second layer arrangement contains at least one circuit for controlling an operating state of the light-emitting layer.

The second layer arrangement can be arranged on the substrate layer and/or surrounded by the substrate layer. In this case, it is possible for at least one circuit of the second layer arrangement to be arranged on the substrate layer and for at least one circuit of the second layer arrangement to be surrounded by the substrate layer. Furthermore, it is also possible for all circuits, that is to say the complete second layer arrangement, to be surrounded by the substrate layer. The second layer arrangement is then completely integrated into the substrate layer and thus arranged in a space-saving manner.

The second layer arrangement can comprise two or a multiplicity of different circuits which undertake different tasks in the module.

In this case, it is possible for at least one of the circuits to be completely surrounded by the substrate layer and for at least one of the circuits to be arranged on the substrate layer or partly surrounded by the substrate layer. That is to say that one of the circuits can be integrated in the substrate layer, while another circuit is free of the substrate layer at least in places.

The first layer arrangement contains, for example, a light-emitting diode, in particular a substrateless light-emitting diode, a CSP (chip scale package) light-emitting diode, an organic light-emitting diode or a high-power light-emitting diode. A CSP light-emitting diode is described in WO 2008/131736, for example, the disclosure of which is hereby incorporated by reference.

The second layer arrangement can contain a circuit for protecting the optoelectronic module against an electrostatic discharge. The circuit for protecting the optoelectronic module against an electrostatic discharge can be formed by doped regions below contact connections for making contact with the first layer arrangement.

The second layer arrangement can contain a circuit for controlling a brightness or a color of a radiation emitted by the light-emitting layer of the first layer arrangement.

The second layer arrangement can furthermore contain a circuit for detecting a brightness of the surroundings of the integrated circuit.

The second layer arrangement can furthermore contain a circuit designed for providing a voltage or a current for generating a radiation of the light-emitting layer of the first layer arrangement.

The substrate layer can, for example, contain silicon or SiC or germanium or gallium nitride or aluminum nitride or aluminum oxide or silicon nitride or a combination thereof or consist of one of the materials. In accordance with a further example, the substrate layer can be embodied as a foil.

An optoelectronic module arrangement is specified below. The optoelectronic module arrangement comprises a plurality of integrated optoelectronic modules according to one of the examples specified above. One of the plurality of optoelectronic modules comprises one layer arrangement which is applied on the substrate layer of the one of the plurality of optoelectronic modules or is surrounded by the substrate layer of the one of the plurality of optoelectronic modules. The one layer arrangement contains a circuit for controlling a radiation emitted by the respective light-emitting layers of the plurality of optoelectronic modules.

The layer arrangement can contain a circuit for a coordination of a brightness, a color or a color mixing of the radiation emitted by the respective light-emitting layers of the plurality of optoelectronic modules.

The layer arrangement can contain, for example, a circuit for a radio remote control of the radiation emitted by the respective light-emitting layers of the plurality of optoelectronic modules.

A method for producing an optoelectronic module is specified below. The method involves growing a first layer arrangement having a light-emitting layer on a carrier layer. The method furthermore involves providing a layer structure having a plurality of semiconductor layers, wherein the plurality of semiconductor layers comprise a substrate layer and a second layer arrangement, wherein the second layer arrangement contains a circuit for controlling an operating state of the light-emitting layer. The first layer arrangement is applied to the substrate layer.

The layer structure having a plurality of semiconductor layers may be provided by the second layer arrangement being applied on the substrate layer or integrated into the substrate layer.

The second layer structure may be applied on the substrate layer by layer deposition or integrated into the substrate layer by ion implantation.

Further features, advantageous configurations and expediences will become apparent from the following description of examples in conjunction with the figures.

FIG. 1 shows an optoelectronic module 1 having an integrated circuit having active and passive electronic components 200, which are prepatterned in a carrier substrate layer. The carrier substrate layer 10 is an Si wafer, for example, in/on which the various integrated circuits 200 are prepatterned. The prepatterning of the carrier substrate already takes place in the front end at the wafer level, such that an optoelectronic module having an integrated circuit arises.

A light-emitting semiconductor layer structure 100 is applied on the carrier substrate layer 10. The semiconductor layer structure 100 comprises light-emitting layers 101, 102, for example. The semiconductor layer structure 100 can contain one or a plurality of LED chips, for example, which emit red, green or blue light, for example. Each LED chip is fixed on the carrier substrate layer 10 by means of a fixing layer 40. By way of example, organic light-emitting diodes (OLED), high-power LEDs or CSP light-emitting diodes can be arranged as radiation-emitting components 100 on the carrier substrate layer 10.

The light-emitting semiconductor layer structure 100 can also be a substrateless LED, for example. In the case of substrateless LEDs, the light-emitting layers 101, 102 are no longer arranged on a carrier material of the carrier 10, for example, a germanium or silicon carrier, but rather are applied directly on the carrier. The light-emitting semiconductor layer structure can be adhesively bonded or soldered onto the carrier substrate layer 10. The use of such LED chips without substrate and front-side contact enables a flat homogeneous construction of the optoelectronic module.

If the semiconductor layer structure 100 is applied to the carrier substrate layer 10, the carrier substrate layer is already prepatterned. The prepatterning is effected by further layer arrangements 200 being applied in or on the carrier substrate layer 10 in the front end. In the front end, for example, a layer arrangement 201 can be introduced in the carrier substrate layer 10, for example, in an Si semiconductor wafer, the layer arrangement designed as a circuit for protecting the light-emitting semiconductor layer structure 100 and/or for protecting further integrated circuits applied in or on the carrier substrate layer 10 against electrostatic discharge. The layer arrangement 201 integrated into the carrier substrate layer 10 can be an integrated protection diode, for example. Furthermore, the circuit 201 can comprise ESD filters integrated into the substrate layer 10.

In the case of the optoelectronic module 1 illustrated in FIG. 1, for example, two light-emitting semiconductor layer structures 100, for example, LED chips, are applied on the carrier substrate layer 10. The optoelectronic module can have further LED chips. For controlling an emission characteristic, a brightness or a color emitted by the light-emitting layers 101, 102 of the LED chips, a further layer arrangement 202 can be arranged on the carrier substrate layer 10 in the front end during the production of the optoelectronic module. By the layer arrangement 202 it is possible, for example, to realize an integrated circuit structure which enables the plurality of LED chips 100 arranged on the carrier substrate layer 10 to be coordinated with one another in terms of their brightness, color and emission characteristic. This makes it possible to homogenize undesired effects as a result of individual luminaries having a conspicuous color cast.

In the optoelectronic module as shown in FIG. 1, a further layer arrangement 203 is applied on the carrier substrate layer 10. The layer arrangement 203 contains the circuit of a photodiode, for example. The layer arrangement 203 is likewise already arranged on the carrier substrate layer 10 in the front end during the photolithographic production of the optoelectronic module.

It has been necessary heretofore for groups of LED chips having an identical or at least a similar emission behavior with regard to brightness and color (wavelength) to have been sorted to produce a homogeneous emission characteristic of the individual LED chips in the production process prior to module population. In the case of the optoelectronic module illustrated in FIG. 1, the ambient brightness can be detected by the photodiode 203. This makes it possible for the light emission of the light-emitting layers 100 to be coordinated with the prevailing ambient brightness. The coordination is effected by the control circuit 202, which controls the brightness, color and emission characteristic of the LED chips 100. High-precision grouping of the LED chips, which is expensive, can only be carried out with high outlay and has been necessary heretofore in the case of a module without regulation, can be avoided by means of the adaptation of the emission of the LED chips.

Regulation of the emission parameters of the individual light-emitting layers 101, 102 makes it possible to correct deviations in the emission characteristic of the individual light-emitting diodes in an end application cost-effectively and effectively. Consequently, a previously unsaleable loss of LED components can still be used. Disturbing influences of lenses or color softening of conversion substances arranged above the light-emitting semiconductor layer structures 100, for example, can likewise be compensated for. The emission characteristic can be coordinated and set on site or in the factory in a manner dependent on the operating conditions and manufacturing variations of the light-emitting layers and, not least, according to the wishes of the user or producer.

A further layer arrangement 204 can be applied on the carrier substrate layer 10. The layer arrangement 204, in the same way as the layer arrangement 201, 202 and 203, is already applied on the carrier substrate layer 10 in the front end by photolithographic processes. By the layer arrangement 204, a circuit structure which serves for the current/voltage regulation of the light-emitting layer structure 100 and/or of the further active integrated circuits, for example, of the control circuit 202, can be integrated into the optoelectronic module 1.

The circuit structure 204 can also be a circuit which is used for the current stabilization and power stabilization of the light-emitting layers. The circuit structure 204 is arranged on the carrier substrate layer 10 by means of a fixing layer 40, for example.

For making contact with the optoelectronic module 1, connecting conductors 50, so-called "vias," are provided in the carrier substrate layer 10. Contacts 60 for subsequent solder contact-connection are arranged on the rear side of the carrier substrate layer, contacts being connected to the vias 50. The contacts can be bump contacts 61 or bonding pad contacts 62, for example.

A further layer arrangement is provided on the carrier substrate layer 10 to connect the layer arrangements 100 and 200 among one another and/or to the contacts 60. The layer arrangement can be vapor-deposited or sputtered onto the carrier substrate layer 10 as a conductor track 30, for example.

For protecting the structures 100 and 200 shown in FIG. 1, a radiation-transmissive protective layer 20 is applied over the carrier substrate 10. The protective layer 20 can contain an acrylic resin, an epoxy resin or a silicone resin or a silicone, for example. Luminescence conversion particles can be embedded into the protective layer 20.

FIG. 2A shows an optoelectronic module that is illustrated in a sectional drawing in FIG. 2B. A light-emitting semiconductor layer structure 100 is arranged on a top side of a substrate layer 10, for example, an Si layer. The semiconductor layer structure 100 is connected to conductor tracks 30 which are likewise arranged on the top side of the substrate layer 10. The conductor tracks 30 can be embodied as contact connections composed of gold, for example. The contact connections are connected to a rear-side contact 31 by means of the plated-through holes 51. The rear-side contact can be a metallic layer, for example a gold layer.

A layer arrangement 201 is situated below a partial area of the contact connections. The layer arrangement 201 can comprise, for example, the doped regions 201a and 201b shown in FIG. 2A which are formed by ion implantation in the substrate layer 10. The layer structure composed of the doped regions 201a and 201b forms an ESD protection diode, for example, a Schottky diode. The properties of the diode can be predetermined during the production of the doped regions 201a and 201b by modification of the dimensions of the doped regions and the distance between the doped regions.

With regard to the forward direction, the ESD protection diode 201 is arranged in antiparallel fashion with respect to the forward direction of the diode structure of the light-emitting semiconductor layer structure 100. In the event of an electrostatic charging of the diode structure of the semiconductor layers 100, charge carriers can be dissipated by the ESD protection diode 201 embedded into the substrate layer 10.

FIG. 3 shows a further optoelectronic module 1. In the optoelectronic module as shown in FIG. 3, further layer arrangements 201, 202, 205, 206 have been integrated into a carrier substrate layer 10 by photolithographic processes in the front end. The layer arrangements realize integrated circuits which serve for ESD protection and for control/regulation of the light-emitting layers 100.

The light-emitting layers 100, which can be LED chips, for example, are arranged on the carrier substrate layer 10 in a manner similar to that in the case of the embodiment shown in FIG. 1. The LEDs are adhesively bonded or soldered onto the substrate layer, for example. The light-emitting layers can be embodied, for example, as organic light-emitting diodes (OLED), high-power light-emitting diodes or CSP light-emitting diodes. A diffuser or converter 70 can be arranged above the light-emitting layers 100. By a converter 70 of this type, the radiation generated by the light-emitting layers 101, 102 of the layer arrangement 100 can be converted into radiation having a different wavelength. The optoelectronic module can thereby emit mixed-colored, preferably white, light.

For controlling an emission characteristic of the individual light-emitting layers 101, 102, in particular for controlling a brightness and color of the emitted light, a layer arrangement 202 has been integrated into the carrier substrate layer 10 in the front end during production of the optoelectronic module. The control circuit 202 makes it possible, for example, to produce a color mixing of the light emitted by the light-emitting layers 101, 102. As a result, particularly when a plurality of LED structures 100 are arranged on the carrier substrate 10, white point finding is made possible.

The control of the light emission of the light-emitting semiconductor layer structure 100 can be effected in a manner dependent on a temperature, for example. For this purpose, the layer arrangement 202 can contain a circuit 205 for detecting the temperature of the optoelectronic module.

Control of the emission characteristic of the light-emitting layers 100 can be effected in a manner dependent on the ambient brightness. For this purpose, a layer arrangement 203 embodied as a photodiode circuit, for example, is applied on the top side of the carrier substrate layer 10 by means of photolithographic processes. An optical element 80, preferably an element for beam shaping, for example, a lens, can be arranged above the photodiode. After evaluation of the ambient brightness detected by the photodiode, the control circuit 202 regulates the light generation of the light-emitting layers 100.

The light emission can be changed by a user by radio remote control. For this purpose, the layer arrangement 202 can contain a receiving circuit for receiving control signals that have been transmitted by a transmitting unit via a radio link.

For protecting the active circuit structures integrated in or on the carrier substrate layer 10 and also the light-emitting layers 101, 102 against destruction on account of an electrostatic discharge, a layer arrangement 201 is prepatterned in the substrate layer 10. The layer arrangement 201 realizes an ESD protection circuit. The ESD protection circuit can be, for example, a protection diode integrated into the substrate layer 10. The circuit structure 201 can also realize ESD filters. The circuit structure 201 can also be any other passive network which has already been integrated into the wafer 10 by photolithographic processes in the front end during the fabrication of the carrier substrate layer 10.

For dissipating heat that has been generated by the circuit structures 200 of the optoelectronic module and also by the light-emitting semiconductor structures 100, a heat sink 300 is provided. The LED semiconductor structures 100 are connected to the heat sink. The heat sink 300 can be a high-performance heat sink formed from a carbon-like diamond, for example. The heat sink can be integrated in the substrate layer 10 and/or at the top side of the substrate layer, for example, of a silicon wafer.

Furthermore, an active or passive cooling device can also be integrated in the rear part of the silicon submount 10. For the active cooling of elements of the optoelectronic module, by way of example, micropumps 206 can also be integrated into the carrier substrate layer 10. Further microelectromechanical systems can be integrated or prepatterned, during the fabrication of the optoelectronic module, in or on the substrate layer 10 as early as during wafer processing in the front end before the LEDs are adhesively bonded or soldered onto the top side of the substrate layer 10. Such systems also include, for example, high-performance silicon relay circuits or solar cells as power supply, particularly for small inaccessible control modules.

The LED structures 100 are connected to the circuit structures 200 prepatterned or integrated in or on the wafer by wiring planes containing conductor tracks 30. The LEDs can also be connected to control and regulating elements integrated into the wafer rear side by the conductor tracks 30. Furthermore, programmable logic switching elements having a storage capability can be integrated into the rear side of the silicon submount. These regulating and/or switching elements can likewise be programmed by radio remote control or by conductor tracks 30 or be in a steady state. Instead of the rear side, integration into the front side may also suffice. In the case of a large silicon circuit outlay, a plurality of Si layers can be stacked. The operating point of the optoelectronic module can be set in an application-specific manner by this logic circuitry. The trimming of the optoelectronic module 1 can also be effected permanently in the factory. Aging processes can thus be compensated for.

For making contact with the optoelectronic integrated circuit, external connections 60 are provided, which can be embodied as bump contacts 61 or bonding pad contacts 62. For connecting the external connections to the circuit structures of the optoelectronic module, connecting conductors (vias) 50 are provided within the substrate layer 10. For connecting the integrated optoelectronic module 1 to further integrated optoelectronic modules to form a module arrangement, connections 63 for module interconnection can be provided, for example, on the top side of the carrier substrate layer 10, for example, on a side of the carrier substrate layer not directly in the optical beam path. The connections 63 can be embodied, for example, as electrical, mechanical or optical plug or screw connections.

Materials used for the carrier substrate layer 10 are preferably Si, SiC, Ge, GaN. Furthermore, the carrier material can comprise aluminum nitride, aluminum oxide or silicon nitride. To prevent the light generated by the light-generating layers from generating free charge carriers in the carrier layer embodied as a semiconductor wafer, the carrier substrate layer 10 is coated with a passivation layer 400, in particular at the top side in the region of the light-emitting layers 100. Further protective layers, conversion layers, antireflection layers or further optical elements can be arranged above the passivation layer 400.

It is also possible to use a flexible foil as the carrier substrate layer 10 instead of a silicon wafer. The foil can be adhesively bonded. The heat dissipation and/or power supply can be regulated by means of suitable strips.

The structures of the optoelectronic module as shown in FIGS. 1, 2 and 3 can be arranged in a housing. In many cases, a housing is no longer necessary. The modules can be introduced, for example, directly into a halogen retrofit mount.

FIGS. 4 and 5 illustrate a production method for producing an optoelectronic module as shown in FIGS. 1, 2 and 3. FIG. 4 shows a carrier layer 500, on which a layer arrangement 100 having light-emitting layers 101, 102 is grown. The light-emitting layers can be epitaxial layers, for example, which grow on a sapphire as carrier layer. The light-emitting layers 101 and 102 are lifted off from the carrier layer 500 and provided with contacts, for example, with metal contacts.

As illustrated in FIG. 5, the LED chips comprising the light-emitting layers with the metal contacts are arranged on a prepatterned carrier substrate layer 10. The carrier substrate layer 10 can be a silicon wafer, for example, into which circuits 200, as described with reference to FIGS. 1, 2 and 3, have already been integrated in the front end during the fabrication of the wafer. The circuits 200 can be, for example, control and regulation circuits for controlling an emission characteristic, a brightness or a color mixing of the LED chips or ESD protection circuits. For controlling the brightness of the radiation generated by the LED chips 100, the semiconductor wafer 10 may already have been prepatterned in the front end with a layer arrangement embodied as a photodiode. The individual circuits 201, 202, 203, 204, 205, 206 and 207 described with reference to FIGS. 1, 2 and 3 can be integrated, for example, by a photolithographic method during production or processing of the semiconductor wafer 10. The circuits are applied, for example, as layer structures by deposition of individual layers on the carrier substrate layer 10. Furthermore, layers can be integrated directly into the carrier substrate by doping processes or by ion implantation.

During production of an optoelectronic module, as many components as possible are integrated directly on or in the carrier substrate 10 in front-end processes. Alongside the circuits shown in FIG. 5, logic circuits, vias, heat-conducting layers and also contact connections, in particular bonding pad and bump contacts for subsequent solder contact-connection, can also be prepatterned on or in the semiconductor wafer. This avoids the application of individual components, for example, by a pick-and-place method. Since the functional units are constructed in a manner integrated in parallel on a wafer and are only separated at the end of fabrication, optoelectronic modules of this type are particularly compact and cost-effective in terms of their production.

FIG. 6 shows a module arrangement in which a plurality of optoelectronic modules 1, 2 and 3 are connected to one another. The individual optoelectronic modules associated with the module arrangement can have, for example, the construction shown in FIG. 1, 2 or 3. The optoelectronic modules are connected to one another by the module interconnections 63.

In the case of the module arrangement shown in FIG. 6, the optoelectronic module 1 has an integrated control circuit 202 which is prepatterned in the carrier substrate layer 10. The control circuit 202 serves for controlling the entire module arrangement. The individual optoelectronic modules 1, 2 and 3 can be coordinated with one another or with the surroundings, for example, with the ambient brightness, autonomously or in a coupled fashion. Consequently, by way of example, rooms can be illuminated with warm- or cold-white radiation that is homogeneous from luminaire to luminaire. Effects as a result of individual luminaries having a conspicuous color cast can be homogenized.

By virtue of the use of the control circuit 202 integrated into the carrier substrate layer 10, the module arrangement shown in FIG. 6 can be operated in a master/slave technique. This makes it possible to effect, by way of example, a color mixing and hence white point finding in the module arrangement and in a corresponding manner also with respect to other modules.

The module arrangements shown in FIG. 6 can be used, for example, for illuminating a room or part of the room, for example, for illuminating a store counter for foodstuffs. The possibility of operating the module arrangement using a master/slave technique enables the individual LED chips arranged on the optoelectronic modules to be driven in such away that, for example, all the foodstuffs are illuminated uniformly independently of the ambient brightness and the contents of the counter. The master circuit can, for example, drive the connected integrated circuits of the individual modules in such a way that a power-saving program is activated if, for example, there are no customers in front of the counter.

The possibility of altering the emission characteristic of the light-emitting diodes also makes it possible, for example, to compensate for aging effects of the light-emitting diodes, particularly when, for example, red diodes emit light initially more brightly and later more than proportionally more darkly than blue light-emitting diodes in the same module arrangement. By the control and regulation of the emission characteristic it is possible to vary the color mixing, such that, by way of example, it is possible to reliably prevent meat products in a store counter for foodstuffs from being illuminated with a green cast.

This disclosure is not restricted to the examples by the description on the basis of those examples. Rather, the disclosure encompasses any novel feature and also any combination of features, which in particular includes any combination of features in the appended claims, even if the feature or combination thereof is not explicitly specified in the claims or examples.

The invention claimed is:

1. An optoelectronic module comprising:
a layer structure having a plurality of semiconductor layers comprising a substrate layer, a first layer arrangement and a second layer arrangement,
wherein 1) the first layer arrangement has a light-emitting layer arranged on the substrate layer, 2) the second layer arrangement contains at least two circuits that control an operating state of the light-emitting layer, and 3) at least one of the circuits is completely surrounded by the substrate layer and at least one of the circuits is arranged on the substrate layer and/or partially surrounded by the substrate layer.

2. The optoelectronic module as claimed in claim 1, wherein at least one conductor track which is electrically conductively connected to at least one circuit of the second layer arrangement is surrounded by the substrate layer.

3. The optoelectronic module as claimed in claim 1, wherein the second layer arrangement contains a circuit that protects the optoelectronic module against an electrostatic discharge.

4. The optoelectronic module as claimed in claim 3, wherein the circuit that protects the optoelectronic module against an electrostatic discharge is formed by doped regions of the substrate layer below conductor tracks embodied as contact connections that make contact with the first layer arrangement.

5. The optoelectronic module as claimed in claim 1, wherein the second layer arrangement contains a circuit that controls brightness or a color of radiation emitted by the light-emitting layer of the first layer arrangement.

6. The optoelectronic module as claimed in claim 1, wherein the second layer arrangement contains a circuit that detects brightness of the surroundings of the integrated circuit.

7. The optoelectronic module as claimed in claim 1, wherein the second layer arrangement contains a circuit that provides a voltage or a current that generates radiation of the light-emitting layer of the first layer arrangement.

8. The optoelectronic module as claimed claim 1, wherein the second layer arrangement contains a circuit that protects the optoelectronic module against an electrostatic discharge and a circuit that controls brightness or a color of radiation emitted by the light-emitting layer of the first layer arrangement, and a circuit that detects brightness of surroundings of the integrated circuit, and a circuit that provides a voltage or current that generates radiation of the light-emitting layer of the first layer arrangement, such that a part of the circuit is free of the substrate layer.

9. An optoelectronic module arrangement comprising:
a plurality of optoelectronic modules as claimed in claim 1,
wherein one of the plurality of optoelectronic modules comprises one layer arrangement applied on the substrate layer of one of the plurality of optoelectronic modules or is surrounded by the substrate layer of one of the plurality of optoelectronic modules,
wherein the one layer arrangement contains a circuit radiation emitted by respective light-emitting layers of the plurality of optoelectronic modules.

10. The optoelectronic module arrangement as claimed in claim 9,
wherein the layer arrangement contains a circuit that coordinates brightness, a color or a color mixing of the radiation emitted by the respective light-emitting layers of the plurality of optoelectronic modules.

11. The optoelectronic module arrangement as claimed in claim 9,
wherein the layer arrangement contains a circuit for a radio remote control of the radiation emitted by the respective light-emitting layers of the plurality of optoelectronic modules.

12. A method of producing an optoelectronic module comprising:
growing a first layer arrangement having a light-emitting layer onto a carrier layer,
providing a layer structure having a plurality of semiconductor layers comprising a substrate layer and a second layer arrangement, wherein the second layer arrangement contains at least two circuits that control an operating state of the light emitting layer, and at least one of the circuits is completely surrounded by the substrate layer and at least one of the circuits is arranged on the substrate layer and/or partially surrounded by the substrate layer, and
applying the first layer arrangement to the substrate layer.

13. The method as claimed in claim 12,
wherein the layer structure having a plurality of semiconductor layers is provided by the second layer arrangement being applied on the substrate layer or being integrated into the substrate layer.

14. The method as claimed in claim 12,
wherein at least one circuit of the second layer arrangement is applied on the substrate layer by layer deposition and/or integrated into the substrate layer by ion implantation.

15. The method as claimed in claim 13,
wherein at least one circuit of the second layer arrangement is applied on the substrate layer by layer deposition and/or integrated into the substrate layer by ion implantation.

16. The optoelectronic module arrangement as claimed in claim 10,
wherein the layer arrangement contains a circuit for a radio remote control of the radiation emitted by the respective light-emitting layers of the plurality of optoelectronic modules.

\* \* \* \* \*